United States Patent [19]

Holloway

[11] Patent Number: 4,891,533
[45] Date of Patent: * Jan. 2, 1990

[54] MOS-CASCODED BIPOLAR CURRENT SOURCES IN NON-EPITAXIAL STRUCTURE

[75] Inventor: Peter R. Holloway, Andover, Mass.

[73] Assignee: Analog Devices, Incorporated, Norwood, Mass.

[*] Notice: The portion of the term of this patent subsequent to Jul. 7, 2004 has been disclaimed.

[21] Appl. No.: 581,288

[22] Filed: Feb. 17, 1984

[51] Int. Cl.[4] .................. H03K 3/20; H03K 3/353; G05F 3/04
[52] U.S. Cl. .................................. 307/303; 307/304; 307/296.1; 323/312; 357/43; 341/159
[58] Field of Search .............. 357/42, 43; 307/570, 307/303, 296 R

[56] References Cited

U.S. PATENT DOCUMENTS

| | | | |
|---|---|---|---|
| 3,601,628 | 8/1971 | Redwine | 357/43 |
| 3,609,479 | 9/1971 | Lin | 357/42 |
| 3,622,812 | 11/1971 | Crawford | 357/43 |
| 3,639,787 | 2/1972 | Lee | 357/43 |
| 3,997,892 | 12/1976 | Sussett | 340/347 DA |
| 4,678,936 | 7/1987 | Holloway | 307/303 |

OTHER PUBLICATIONS

Wyland, IBM Technical Disclosure Bulletin, vol. 13, No. 1, Jun. 1970, pp. 204–205.

*Primary Examiner*—William D. Larkins
*Attorney, Agent, or Firm*—Parmelee, Bollinger & Bramblett

[57] ABSTRACT

A 16-bit D/A converter formed on a single monolithic chip and having two cascaded stages each including a 256-R resistor string DAC. The analog output voltage of the first stage is coupled to the second stage by two buffer amplifiers each formed by a non-epitaxial process using a P-type substrate. The amplifiers include NMOS and PMOS-cascoded bipolar current sources arranged to avoid the use of metallization to provide for electrical interconnections within the source.

7 Claims, 3 Drawing Sheets

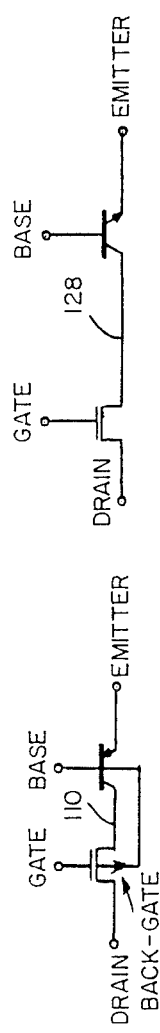
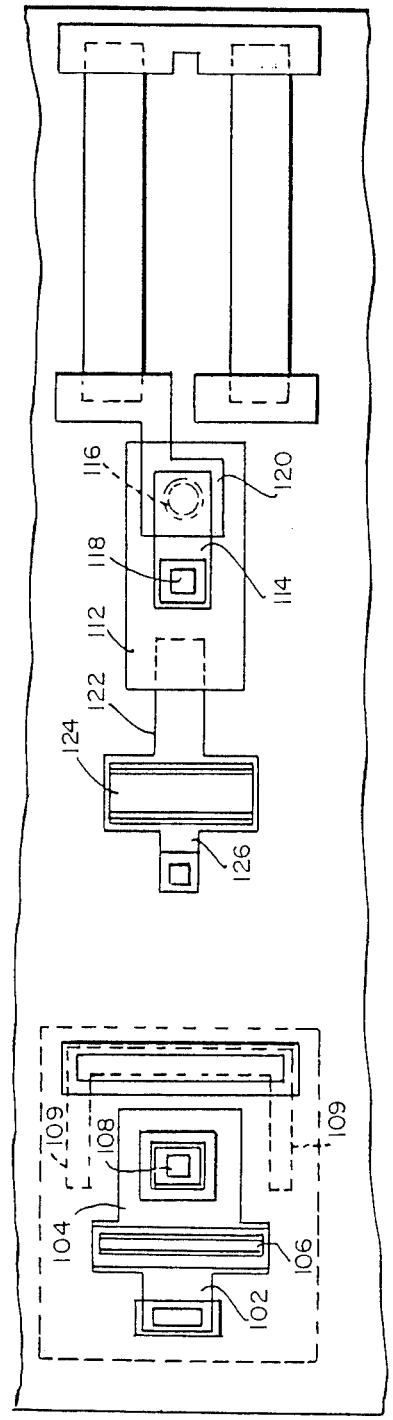
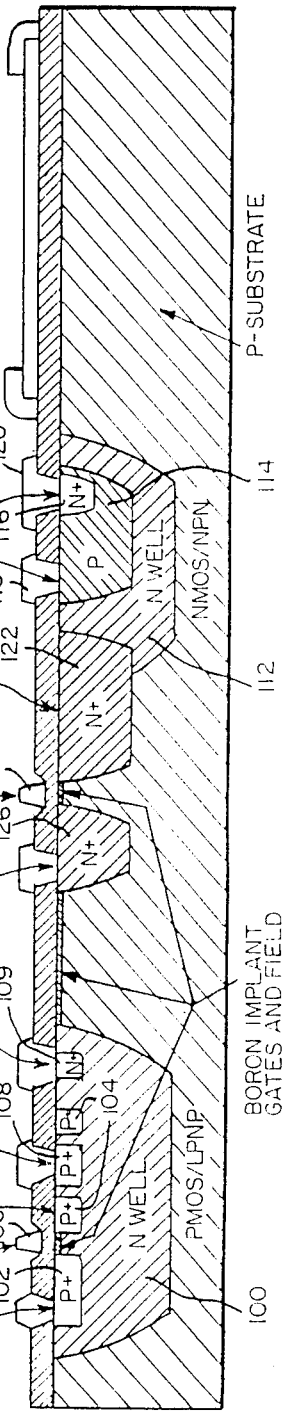
FIG. 3C
FIG. 3B
FIG. 3A

MOS-CASCODED BIPOLAR CURRENT SOURCES IN NON-EPITAXIAL STRUCTURE

BACKGROUND OF THE INVENTION

1. Field of the Invention

This invention relates to current sources formed on an integrated-circuit (IC) chip. More particularly, this invention relates to MOS-cascoded bipolar current sources such as may be used as part of a high-performance amplifier circuit. The invention is described herein for use in amplifiers employed in a cascaded two-stage D/A converter.

2. Description of the Prior Art

Susset U.S. Pat. No. 3,997,892 shows a two-stage cascaded D/A converter wherein the first stage includes a resistor-string DAC to produce a first segment voltage corresponding to a set of higher-order input bits. That voltage is directed through buffer amplifiers to the second stage converter which interpolates the selected first-stage segment voltage in accordance with the lower-order bits.

For such a converter to perform successfully at high resolutions, such as 16-bits, the inter-stage buffer amplifiers must meet extremely stringent specifications. It has been found that such specifications cannot be achieved using known techniques.

SUMMARY OF THE INVENTION

An IC amplifier design is provided utilizing uniquely-configured MOS-bipolar current sources which significantly enhance the performance of the amplifier. These current source structures are formed using an N-well non-epitaxial IC process, and advantageously make possible inter-connections within the current source without the need for bridging metallization. Although the current sources are disclosed in an amplifier implementation, such current sources can find application in other types of integrated circuits.

Still other objects, aspects and advantages of the invention will in part be pointed out in, and in part apparent from, the following description of a preferred embodiment considered together with the accompanying drawings.

BRIEF DESCRIPTION OF THE DRAWINGS

FIGS. 3A, 3B and 3C show details of N-type and P-type MOS-cascoded bipolar current sources formed with a non-epitaxial process, and adapted for use in the amplifier of FIG. 2.

DETAILED DESCRIPTION OF A PREFERRED EMBODIMENT

Figure 1:
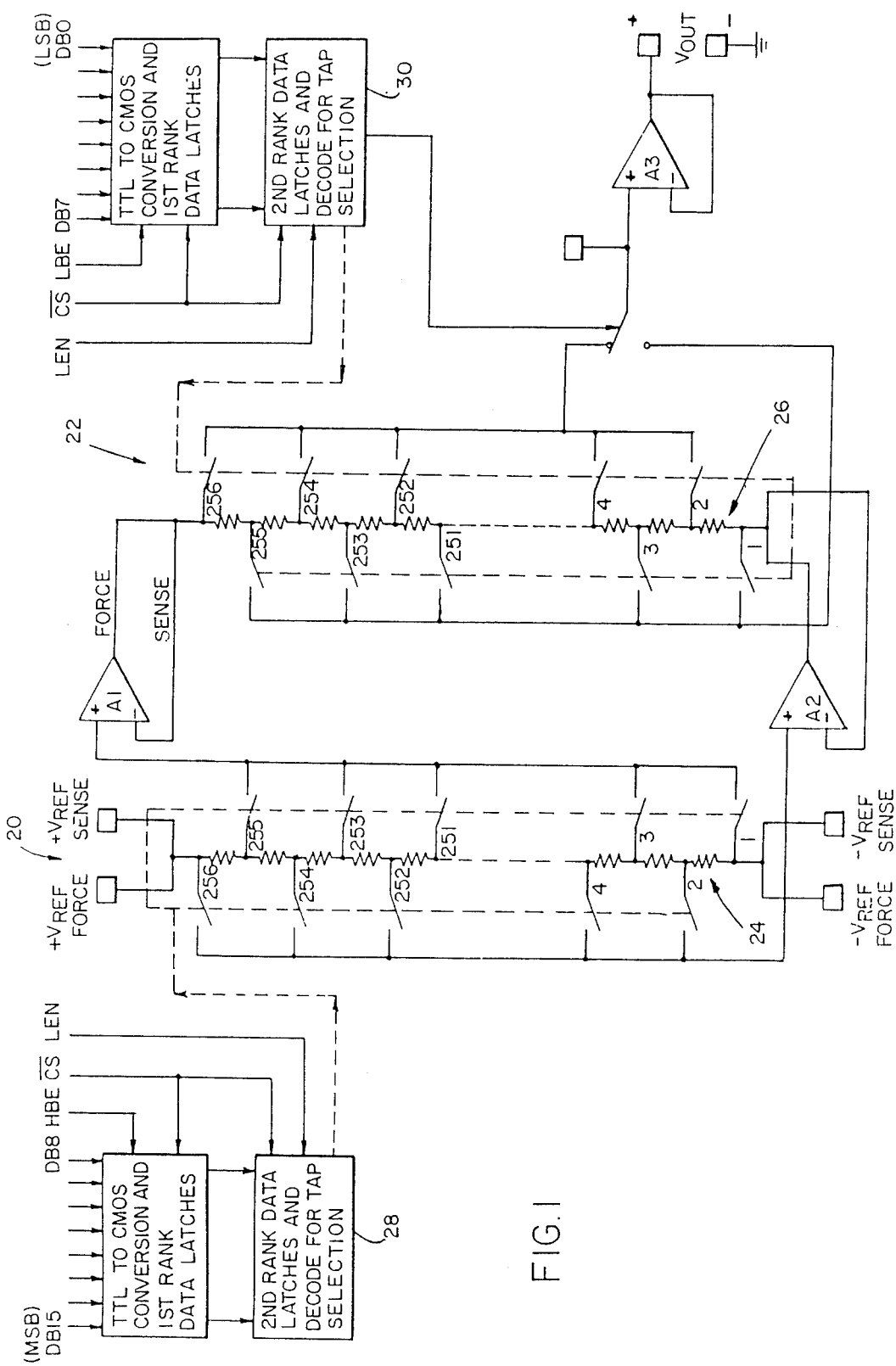
FIG. 1 is a simplified diagrammatic showing of a two-stage cascaded D/A converter.

Referring first to FIG. 1, which is a simplified diagram of a 16-bit D/A converter, it will be seen that the device includes two cascaded stages generally indicated at 20 and 22. Each stage comprises a 256-R resistor string 24,26. Logic circuitry 28, 30 of known type of design is used to develop the switch control signals for the respective stages. Buffer amplifier $A_1$, $A_2$ are employed to direct the first-stage segment output voltage to the second stage where it is applied to the ends of the resistor string 26.

The first stage resistor string 24 receives a voltage shown as $+V_{REF}$ AND $-V_{REF}$. That voltage is divided by the resistor string into 256 nominally equal voltage segments. Any two adjacent voltage taps are selected in accordance with the upper byte (8 bits) of the 16-bit input word. Amplifier $A_1$ transfers the voltage of one selected tap (e.g. tap 251) to the top of the second stage. Amplifier $A_2$ transfers the voltage from an immediately adjacent tap (e.g. tap 252) to the bottom of the second stage. The output amplifier $A_3$ produces a signal linearly interpolating the voltage drop between taps 251 and 252, weighted by the lower byte of the 16-bit input word.

Details of the switch selector system and the associated resistor string for this converter are disclosed in copending application Ser. No. 581,133, filed by the present applicant on Feb 17, 1986, now U S. Pat. No. 4,543,560.

Figure 2:
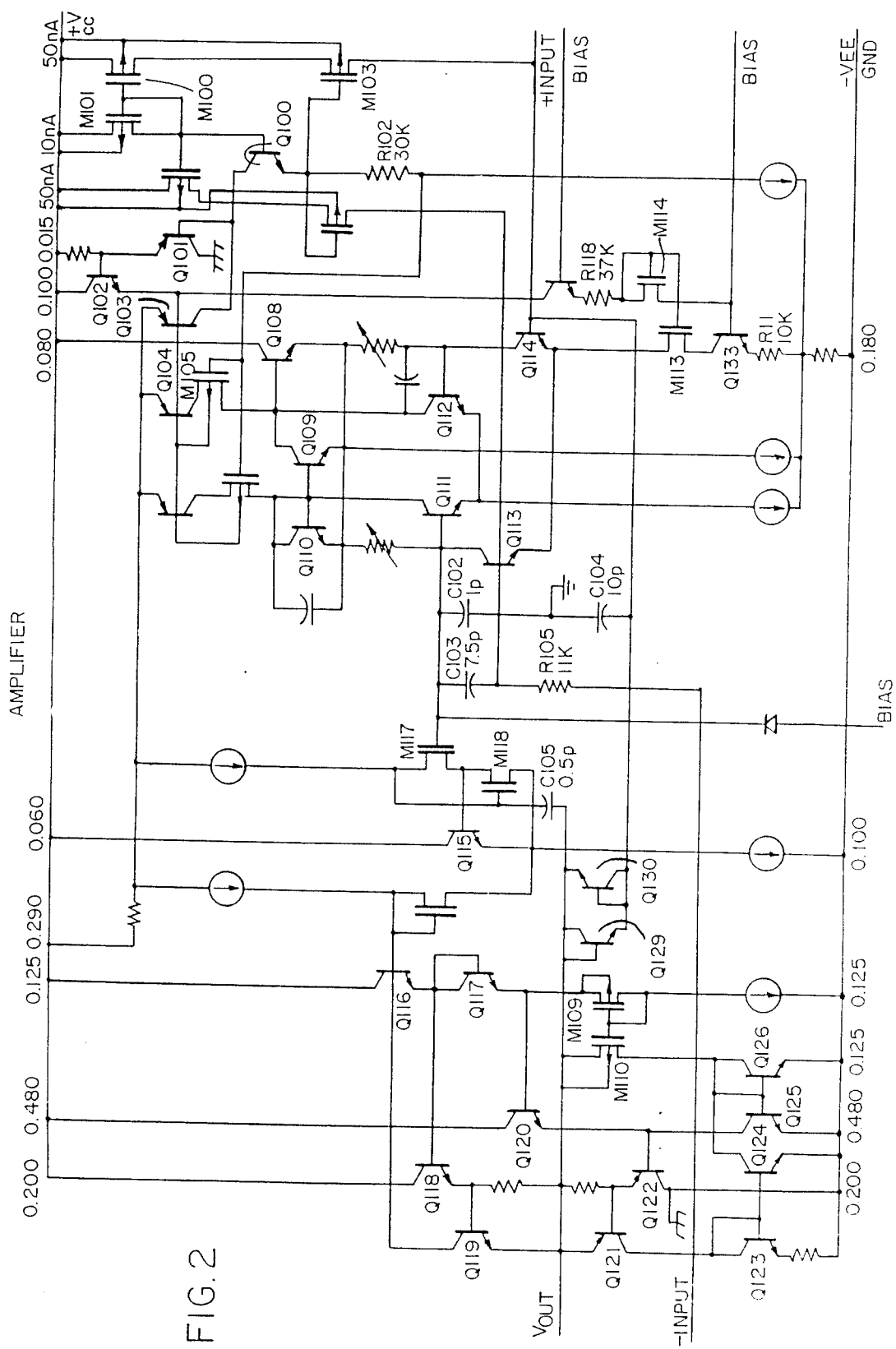
FIG. 2 is a circuit diagram of an amplifier used in the converter of FIG. 1.

FIG. 2 shows a simplified circuit diagram of an amplifier suitable for use as amplifiers $A_1$, $A_2$ and $A_3$. These amplifiers were specified to settle to 16 bits in 3 $\mu$s and simultaneously be high precision dc op-amps. The amplifier includes a single differential gain stage $Q_{113}$, $Q_{114}$, which uses an immitance inverter $Q_{108-112}$ as a load, followed by an MOS/bipolar unity gain impedance buffer. This dominant pole compensated amplifier achieves an $A_{VOL}$ of $10^6$ through the use of boot-strapping. This minimizes the signal dependent $V_{CB}$ modulation in $Q_{113,114}$ and raises the differential load impedance of the gain stage by a factor equal to the loop gain of the amplifier formed by $Q_{108-112}$, and, finally, linearizes the MOS/bipolar unity gain buffer by making $V_{DS}$ track between $M_{117}$ and $M_{119}$.

To preserve open loop gain, all current sources (shown as an arrow-in-a-circle) are MOS-cascoded bipolar structures. Details of one such current source are shown at $M_{113}$ and $Q_{133}$. The resulting impedance enhancement afforded by the reverse voltage transfer ratio of the FET permits an Early voyage of $10^6$ volts to be achieved at the drain of $M_{113}$. Similarly, $Q_{104}$ and $M_{105}$ provide the same advantage for sources originating from the positive supply, side-stepping the inherently low impedance of the split vertical/lateral PNP's which are unavoidable device problems in a non-epitaxial process. $I_b$ compensation is provided by a PMOS current reflector, operating in subthreshold, shown in part by $M_{101-103}$ and $Q_{100}$. The Darlington NPN/vertical output stage has an $I_b$ booster for the output VPNP, $Q_{122}$. $M_{109,110}$ in conjunction with $Q_{125,126}$ boosts the base drive into the output when $V_{out}$ lags the voltage at the emitter of $Q_{117}$ under negative slew. The amplifier occupies 1500 mil$^2$ and settles to 10 ppm in 3 $\mu$s.

The configuration of such P-type and N-type MOS-cascoded bipolar current sources are shown in FIGS. 3A and 3B, representing the cross-section and plan views respectively of the devices. FIG. 3C shows the electrical circuit representation of each device, approximately aligned with the corresponding elements of FIGS. 3A and 3B.

Referring now to the left-hand portion of FIGS. 3A and 3B, the non-epitaxial P-type substrate is doped to form the usual N-well 100. At the left end of the N-well is a first P-type diffusion 102 of generally rectilinear outline which serves as the drain of a PMOS device. The source of this device is formed by a second P-type diffusion 104 having its principal portion arranged as a square-shaped ring. The PMOS gate 106 is positioned between the source and drain.

Within the square ring of diffusion 104 is another P-type diffusion 108 which serves as the emitter of a lateral PNP transistor. The N-type material of the N-well serves as the base of this transistor, and connection is made to the base by an N+ diffusion 109 of generally U-shape and extending partially around the square-ring P-type diffusion 104. The collector of the LPNP is diffusion 104, shared as above by the PMOS source. Thus it will be seen that this diffusion serves as both the collector of the LPNP and the source of the PMOS device.

Since both of these functions are performed by the same diffusion, the PMOS source and the PNP collector are effectively connected together electrically, without any need for bridging metallization. That is, no additional layer of metal has to be added to the substrate to make this connection, which is illustrated in the circuit diagram of FIG. 3C at 110.

No electrode is provided for the P-type diffusion 104, since no external connection is needed to be made to the source/collector of the MOS-bipolar current source. Electrodes are provided for the PMOS drain and for the base and emitter of the LPNP transistor.

A distinct characteristic of the PMOS-bipolar current source is that the entire circuit is integrated into a single N-well, which affords important benefits in carrying out the process.

Turning now to the right-hand portion of FIGS. 3A and 3B, there is shown another N-well diffusion 112 within which is a P-type diffusion 114 containing another N-type diffusion 116. These three elements function respectively as the collector, base and emitter of an NPN transistor. Base and emitter electrodes 118, 120 are formed above the substrate to make the necessary connections.

The N-well 112 is effectively extended laterally by means of an N+ diffusion 122 which overlaps the initial N-type diffusion. The N+ diffusion reaches to a region alongside a gate electrode 124, and a further N+ diffusion 126 is made on the other side of the gate. This latter diffusion serves as the drain of an NMOS device. The source of this device is formed by the N-type material with the N-well 112.

Thus, it will be seen that the N-well 112 (which in this embodiment includes extension 122) serves as both the source of an NMOS device and the collector of an NPN transistor. Accordingly, these two elements are effectively electrically connected, as indicated at 128 in FIG. 3C, without the need for a metallization layer. The inclusion of diffusion 122, a low resistivity source-drain diffusion comparable to that routinely used in N-MOS and CMOS fabrication, is to enhance the performance of the composite structure through the reduction of the ohmic resistance diagrammatically represented as path 128 in FIG. 3C. The operation of this invention is otherwise unaffected by the omission of 122.

Although a preferred embodiment of this invention has been described hereinabove in detail, it is desired to emplhasize that this has been for the purpose of illustrating the invention, and should not be considered as necessarily limitative of the invention, it being understood that many modifications can be made by those skilled in the art while still practicing the invention claimed herein.

What is claimed is:

1. In a monolithic integrated circuit having a P-type substrate with an N-well therein;
    a P-type MOS-cascoded bipolar current source connected in said circuit and comprising:
    first and second separate P-type diffusions in said N-well to serve as the drain and source of a PMOS device;
    a gate positioned between said first and second P-type diffusions;
    a third P-type diffusion in said N-well separate from said first and second diffusions and serving as the emitter of a lateral PNP transistor having said second P-type diffusion as its collector and said N-well as its base;and
    electrodes making connection with said first and third P-type diffusions and said N-well;
    whereby said PMOS source and said bipolar collector are electrically connected without requiring a diffusion-to-metal-to-diffusion interconnection.

2. An integrated circuit is claimed in claim 1, including an N-type diffusion in said N-well to make connection between an electrode and said N-well, said N-well providing the back-gate connection for said PMOS device.

3. An integrated circuit as claimed in claim 2, wherein said second P-type diffusion surrounds said third P-type diffusion.

4. An integrated circuit as claimed in claim 3, wherein said N-type diffusion extends partially around said second P-type diffusion.

5. An integrated circuit as claimed in claim 4, wherein said second P-type diffusion is a ring at least approximately square in shape;
    said N-type diffusion being at least approximately U-shaped, with the two arms of the "U" extending along two respective parallel sides of the square P-type diffusion.

6. In a monolithic integrated circuit having a P-type substrate with an N-well therein;
    an N-type MOS-cascoded bipolar current source connected in said circuit and comprising:
    a P-type diffusion in said N-well to serve as the base of an NPN transistor;
    an N-type diffusion in said P-type diffusion to serve as the emitter of said NPN transistor;
    electrodes contacting said P-type and N-type diffusions to make connection to said base and said emitter;
    said N-well serving as the collector for said NPN transistor;
    an N-type diffusion in said P-type substrate, externally of said N-well, to serve as the drain of an NMOS device;
    an electrode contacting said external N-type diffusion;
    a gate for said NMOS device adjacent said external N-type diffusion;
    said N-well comprising N-type material extending to a region which is adjacent said gate but on the side thereof which is opposite said external N-type diffusion, said N-type material serving as the source of said NMOS device and as the collector of said NPN transistor;
    whereby said NPN collector and said NMOS source are effectively connected electrically without requiring a diffusion-to-metal-to-diffusion interconnection.

7. An integrated circuit as claimed in claim 6, wherein said N-well includes an initial N-type diffusion, said N-type material comprising an N+ diffusion partially overlapping said initial N-type diffusion and extending to the side edge of said gate.

* * * * *